US012641387B2

(12) United States Patent
Doll et al.

(10) Patent No.: US 12,641,387 B2
(45) Date of Patent: May 26, 2026

(54) FOUNDRY-COMPATIBLE PROCESS FOR INTEGRATED MICRO-SPEAKER AND MICROPHONE

(71) Applicant: Vibrant Microsystems Inc., Cupertino, CA (US)

(72) Inventors: Joseph Doll, Bend, OR (US); Sanjay Bhandari, Cupertino, CA (US)

(73) Assignee: Vibrant Microsystems Inc., Cupertino, CA (US)

( * ) Notice: Subject to any disclaimer, the term of this patent is extended or adjusted under 35 U.S.C. 154(b) by 248 days.

(21) Appl. No.: 18/354,432

(22) Filed: Jul. 18, 2023

(65) Prior Publication Data

US 2025/0030998 A1      Jan. 23, 2025

(51) Int. Cl.
*H04R 31/00*          (2006.01)
*B81B 7/00*           (2006.01)
(Continued)

(52) U.S. Cl.
CPC ......... *H04R 31/006* (2013.01); *B81B 7/0006* (2013.01); *B81C 1/00246* (2013.01); *H04R 7/04* (2013.01); *H04R 19/02* (2013.01); *H04R 19/04* (2013.01); *H04R 31/003* (2013.01); *B81B 2201/0257* (2013.01); *B81B 2203/0127* (2013.01); *B81B 2203/0315* (2013.01); *B81B 2207/015* (2013.01); *B81B 2207/07* (2013.01); *B81C 2201/0132* (2013.01); *B81C 2201/0177* (2013.01); *B81C 2203/036* (2013.01); *B81C 2203/0728* (2013.01); *H04R 2201/003* (2013.01)

(58) Field of Classification Search
CPC ........ H04R 31/006; H04R 7/04; H04R 19/02; H04R 19/04; H04R 31/003; H04R 2201/003; B81B 7/0006; B81B 2201/0257; B81B 2203/0127; B81B 2203/0315; B81B 2207/015; B81B 2207/07; B81C 1/00246; B81C 2201/0132; B81C 2201/0177; B81C 2203/036; B81C 2203/0728
USPC .............................. 381/174; 438/51, 667, 53
See application file for complete search history.

(56) References Cited

U.S. PATENT DOCUMENTS

2015/0061048 A1* 3/2015 Escher-Poeppel ... H04R 31/006
                                                        438/51
2016/0107883 A1  4/2016 Lee
(Continued)

OTHER PUBLICATIONS

International Search Report and Written Opinion from related matter PCT/US2024/038005 mailed Oct. 28, 2024.

*Primary Examiner* — Norman Yu
(74) *Attorney, Agent, or Firm* — Ogawa P.C.

(57) ABSTRACT

A MEMS audio device includes a first substrate having a first surface, a cavity, and a first vent hole formed through the first substrate, a device layer disposed upon the first substrate comprising a semiconductor material sandwiched between a first and second oxides, wherein a portion of the semiconductor material is substantially free of oxide, wherein the first oxide is disposed against the first surface, and wherein the device layer comprises first contacts, a substrate disposed upon the device layer, including a first vent hole formed through the second substrate, and second electrical contacts coupled to the first electrical contacts, wherein the portion of the semiconductor material forms a diaphragm for the MEMS audio device and wherein the diaphragm is configured to move within the first cavity.

25 Claims, 5 Drawing Sheets

(51) Int. Cl.
B81C 1/00 (2006.01)
H04R 7/04 (2006.01)
H04R 19/02 (2006.01)
H04R 19/04 (2006.01)

(56) References Cited

U.S. PATENT DOCUMENTS

2018/0091906 A1*  3/2018  Khenkin ................ H04R 19/04
2020/0336841 A1  10/2020  Zeleznik et al.
2022/0408179 A1  12/2022  Anderson

* cited by examiner

SECTION AA

FOUNDRY-COMPATIBLE PROCESS FOR INTEGRATED MICRO-SPEAKER AND MICROPHONE

BACKGROUND OF INVENTION

The present invention is directed to micro electro-mechanical systems, commonly termed "MEMS." In particular, the present invention provides a semiconductor foundry-compatible process to fabricate devices such as a MEMS speaker device and a MEMS microphone device, separately or on a common substrate. Although the invention has been described in terms of specific examples, it will be recognized that the invention has a much broader range of applicability.

Loudspeakers, also referred to as speaker drivers or speakers, are electro-acoustic transducers that convert electric signals to the movement of air. Speakers are an essential part of many consumer gadgets such as home music systems, smart watches or wearables, smartphones, laptops, tablets, earbuds, among others. As the thicknesses of mobile devices decrease, speakers have also become smaller in size. Currently, loud speakers refer to a speaker with greater than 4-inch diameter, mini speakers refer to a speaker with a 2-4 inch diameter, and micro speakers refer to speakers with a diameter less than 2-inches. Recently with the popularity of car buds, the size of the speakers has decreased to less than 1-inch diameter.

Most conventional speakers are still designed with conventional technologies that include a thin moving diaphragm of paper, plastic, or similar material, and spring element which is actuated by electromagnetic signals that are proportional to an audio signal input to the speaker. Conventional speakers typically use a permanent magnet to generate a magnetic field in which a moving coil (driven with electrical signals) generates transient electromagnetic forces. Conventional speakers are incompatible with conventional surface mount printed circuit board (PCB) technology which is a disadvantage in the manufacturing flow for original equipment manufacturers (OEM) of electronic systems. Additionally, conventional speaker technology creates additional constraints on the placement of speakers inside smartphones, as an example, as magnets may adversely affect other components in the smartphone such as magnetic sensors and the like. These and other limitations prevent conventional speakers and related technologies from being used in many consumer devices.

In contrast to speakers, microphones have typically been built using different technologies. In some cases, microphones have utilized condenser/capacitance technology, electret condenser technology, MEMS technology among others. As such, the inventors of the present invention believe the integration of microphones and speakers in a monolithic device has not been considered or developed.

In light of the above, what is desired are semiconductor fabrication-compatible methods for manufacturing microphones, speakers, and integrated devices, and devices themselves.

SUMMARY OF INVENTION

The present invention is directed to micro electro-mechanical systems, commonly termed "MEMS." In particular, the present invention provides foundry compatible processes to fabricate a MEMS speaker device, a MEMS microphone, or combined devices and related devices and methods. Although the invention has been described in terms of specific examples, it will be recognized that the invention has a much broader range of applicability.

In an example, the present invention provides a foundry compatible process for fabricating a micro-speaker and a microphone device. The device typically has a cap device comprising a plurality of vent regions for propagating acoustic signals. The cap device can be made of a suitable material such as silicon, or other rigid substrate capable of being processed using semiconductor techniques. In an example, the device has a CMOS (i.e., Complementary metal-oxide-semiconductor) device coupled to the cap device. In an example, the CMOS device comprises at least one vent region (although there may be more) configured to allow backpressure to flow therethrough. The CMOS device can be a CMOS semiconductor substrate, including a plurality of CMOS cells. The device has a cavity region configured between an interior surface of the cap device and a CMOS device interior surface of the CMOS device. The device has a frame device coupled between the cap device and the CMOS device to form an exterior housing for the cavity region. An example, the frame device can be configured on either or both of the cap device and/or the CMOS device or integral with either or both devices.

In an example, the device has a movable diaphragm device comprising a thickness of silicon material having a thickness 0.1 nm to ten microns, and configured spatially in an elongated manner within the cavity region. In an example, the movable diaphragm device has a first surface and a second surface opposite of the first surface. In an example, the movable diaphragm is connected with at least two cantilever or springs. Each of the cantilever or springs being coupled between a peripheral region of the movable diagram device and a portion of a frame configured surrounding the movable diaphragm device.

In an example, the device has a CMOS electrode device configured on the CMOS device interior region. That is, the CMOS device has an electrode device or devices formed on an interior region of the CMOS device. In some embodiments, the CMOS device includes circuitry for the speaker and/or microphone.

In an example, cavities intended for housing the micro speaker and the microphone are etched in the handle wafer, also referred to as the cap wafer, using Deep Reactive Ion Etching (DRIE) process. In an example, the cavity etched handle wafer is bonded to the device wafer forming the diaphragms for the micro speaker and the microphone, with a fusion bonding of the two wafers.

In an example, the surface of the device wafer is grinded down to obtain the desired thickness of the device diaphragm for the micro-speaker and microphone. In an example, the thinning of the device layer is achieved using Chemical Mechanical Planarization (CMP) or Polishing. Alternatively, the device diaphragm can be deposited with the desired thickness as polysilicon using Low Pressure Chemical Vapor Deposition (LPCVD), or the like.

In an example, a sacrificial silicon layer deposited on top of the device using the process of Low Pressure Chemical Vapor Deposition (LPCVD) or grown epitaxially. In an example, the thickness of the sacrificial silicon is decided based on the gap needed for the micro-speaker, microphone or any other out of plane moving device fabricated with the process described with this invention. In an example, in the areas where the micro-speaker and microphone diaphragm needs to have vertical or out of plane motion, the sacrificial silicon is etched out leaving a cavity of desired height or gap. In an example, structures such as mechanical stoppers or bumps, are created using a perforated silicon to limit the out of plane motion of the microphone diaphragm.

In an example, the top surface and oxide of the processed CMOS wafer is passivated with Nitride to protect the processed layers from a later dry etching step of Vapor Hydrogen Fluoride (VHF). In an example, vent holes are etched with DRIE in the CMOS wafer in the areas identified for speaker and microphone from the top (CMOS surface with metal layers) or the back, CMOS surface opposite of the metal surface.

In an example, the wafer stack of the device wafer & handle wafer is bonded to the CMOS wafer with an Aluminum Germanium (AlGe) bond.

In an example, vent holes are etched with DRIE process in the handle or cap wafer in the areas of microphone & speaker. These vent holes allow the speaker & microphone to pass the sound waves from the device to the external environment.

In an example, the diaphragm for speaker and microphone defined by the pattern on the device wafer are released using Vapor Hydro Fluoric (VHF) exposure from the vent holes.

In an example, the device has an electrical connection to the cap or the handle layer of the wafer through the polysilicon or the silicon connected via the AlGe bond to the CMOS wafer. In an example, the device layer or the MEMS diaphragms for the micro speaker and the microphone are driven from the connection of the polysilicon or the sacrificial silicon via the AlGe bond to the CMOS layer.

In an example, the cavity for the micro speaker is etched in the CMOS such that the speaker diaphragm moves between the cap surface and the CMOS electrode. In an example, the cavity for the microphone is etched with space created by etching silicon dioxide between CMOS wafer and the device wafer bonded to it.

According to one aspect, a method for forming a Micro-Electric Mechanical System (MEMS) audio device is disclosed. One method may include receiving a first wafer comprising a first substrate characterized by a first surface, wherein a first cavity is formed within the first substrate, and disposing a device layer upon the first wafer, wherein the device layer comprises a semiconductor material having a first side and a second side, wherein the semiconductor material comprises a first semiconductor material portion, wherein a first oxide layer is formed upon the first side, wherein a second oxide layer is formed upon the second side, wherein a first portion of the first oxide layer is disposed above the first semiconductor material portion, wherein a first portion of the second oxide layer is disposed below the first semiconductor material portion, and wherein the first oxide layer is disposed against the first surface. A process may include forming a first plurality of electrical contacts through the second oxide layer to at least the semiconductor material, receiving a wafer having a second substrate, wherein a plurality of active devices are disposed within the second substrate, wherein a first plurality of vent holes are formed through the second substrate, and wherein a second plurality of contacts are formed on a first surface of the second substrate, and coupling the first plurality of contacts to the second plurality of contacts. A technique may include forming a second plurality of vent holes through the first substrate, wherein a first vent hole from the second plurality of vent holes is coupled to the first cavity, and etching at least the first portion of the first oxide layer and the first portion of the second oxide layer from around the first semiconductor material portion, wherein the first portion of the semiconductor material forms a diaphragm for the MEMS audio device configured to move within the first cavity.

According to another aspect, a Micro-Electric Mechanical System (MEMS) audio device is disclosed. One device may include a first wafer comprising a first substrate characterized by a first surface and comprising a first cavity within the first substrate, wherein the first substrate comprises at least a first vent hole formed through the first substrate and coupled to the first cavity. An device may include a device layer disposed upon the first wafer, wherein the device layer comprises a semiconductor material having a first side and a second side, wherein a first oxide layer is formed upon a portion of the first side, wherein a second oxide layer is formed upon a portion the second side, wherein the semiconductor material comprises a first semiconductor material portion substantially free of the first oxide layer and the second oxide layer, wherein the first oxide layer is disposed against the first surface of the first wafer, and wherein the device layer comprises a first plurality of electrical contacts. Another device may include a wafer disposed upon the device layer, wherein the wafer comprises a second substrate having a plurality of active devices, wherein the second substrate comprises at least a first vent hole formed through the second substrate and coupled to the first cavity, and wherein the wafer comprises a second plurality of electrical contacts coupled to the first plurality of electrical contacts, wherein the first portion of the semiconductor material forms a diaphragm for the MEMS audio device and wherein the first portion of the semiconductor material is configured to move within the first cavity.

According to yet another aspect, a method for forming Micro-Electric Mechanical System (MEMS) audio devices is disclosed. One method may include receiving a first wafer comprising a first substrate characterized by a first surface, wherein a first cavity and a second cavity are formed within the first substrate, disposing a device layer upon the first wafer, wherein the device layer comprises a semiconductor material having a first side and a second side, wherein the semiconductor material comprises a first semiconductor material portion and a second semiconductor material portion, wherein a first oxide layer is formed upon the first side, wherein a second oxide layer is formed upon the second side, wherein a first portion of the first oxide layer is disposed above the first semiconductor material portion, wherein a first portion of the second oxide layer is disposed below the first semiconductor material portion, wherein a second portion of the first oxide layer is disposed above the second semiconductor material portion, wherein a second portion of the second oxide layer is disposed below the second semiconductor material portion, and wherein the first oxide layer is disposed against the first surface, and forming a first plurality of electrical contacts through the second oxide layer to at least the semiconductor material. A technique may include receiving a wafer having a second substrate, wherein a plurality of active devices are disposed within the second substrate, wherein a first plurality of vent holes are formed through the second substrate, and wherein a second plurality of contacts are formed on a first surface of the second substrate, coupling the first plurality of contacts to the second plurality of contacts, and forming a second plurality of vent holes through the first substrate, wherein a first vent hole from the second plurality of vent holes is coupled to the first cavity, and wherein a second vent hole from the second plurality of vent holes is coupled to the second cavity. A process may include etching the first portion of the first oxide layer and the first portion of the second oxide layer from around the first semiconductor material portion and the second portion of the first oxide layer and the second portion of the second oxide layer from around the first semiconductor material portion, wherein the first portion of the semiconductor material forms a diaphragm for a MEMS speaker device configured to move within the first cavity, and wherein the second portion of the semiconductor material forms a diaphragm for a MEMS microphone device configured to move within the second cavity. In some embodiments, the forming the first plurality of electrical contacts may include etching through at least a first portion of the second oxide layer to define a plurality of contact regions, disposing a conductive semiconductor material layer above the second oxide layer and into the plurality of contact regions, and etching at least a first portion of the conductive semiconductor material layer to define the first plurality of electrical contacts comprising conductive semiconductor material, and wherein the etching the at least the first portion of the conductive semiconductor material layer further comprises defining a conductive structure above a second portion of the second oxide layer and above the diaphragm for the MEMS microphone device, and wherein the conducive structure forms a backplane of the MEMS microphone device. Some processes may include forming a first set of electrodes associated with the diaphragm for the MEMS speaker device, wherein a first distance is associated with a distance between the diaphragm for the MEMS speaker device and the first set of electrodes, wherein a second distance is associated with a distance between the diaphragm for the Microphone MEMS device and the backplane, and wherein the first distance is larger than the second distance. Some techniques may include wherein the first distance is within a range of 4 to 50 microns, and wherein the second distance is within a range of 0.1 to 2 microns. Some techniques may include wherein the etching the first portion of the first oxide layer and the first portion of the second oxide layer from around the first semiconductor material portion and the second portion of the first oxide layer and the second portion of the second oxide layer from around the first semiconductor material portion comprises: providing vapor hydrofluoric acid into the first cavity and the second cavity. Some techniques may include The method of claim 21 further comprising: performing a deep reactive ion etching (DRIE) process to the second substrate to form the first plurality of vent holes.

According to yet another aspect, a method for forming a Micro-Electric Mechanical System (MEMS) audio device is disclosed. One process may include receiving a first wafer comprising a first substrate characterized by a first surface, wherein a first cavity is formed within the first substrate, and disposing a first side of a device layer upon the first wafer, wherein the device layer comprises a material, and wherein a first portion of the material is disposed adjacent to the first cavity having a first side and a second side. A technique may include forming a first plurality of electrical contacts to at least the material, and receiving a wafer having a second substrate, wherein a plurality of active devices are disposed within the second substrate. A method may include disposing a second side of the device layer upon the wafer, wherein at least an electrical contact from the first plurality of electrical contacts is coupled to an active device from the plurality of active devices, wherein the first portion of the material forms a diaphragm for the MEMS audio device that is configured to move within the first cavity.

According to yet another aspect, a semiconductor processing method is disclosed. One method may include receiving a semiconductor wafer having a first layer having a first metallic moat structure and a second layer having a second metallic moat structure, and disposing the semiconductor wafer in an etching chamber. A process may include electrically coupling the first metallic moat structure and the second metallic moat structure to ground, and performing a deep reactive ion etching process within a portion of the semiconductor wafer, wherein the portion disposed proximate to the first metallic moat structure and the second metallic moat structure. In some techniques, the first metallic moat structure comprises a geometric structure surrounding a region within the first layer, and the through-hole passes through at least a portion of the region within the first layer. In some techniques, the first metallic most structure comprises a toroidal shape. In other techniques, the first metallic moat structure comprises a concave geometric structure partially enclosing a concave region within the first layer, and the portion of the semiconductor wafer is through at least a portion of the concave region within the first layer. In still other techniques, a deep reactive ion etching process comprises etching a through-hole through the semiconductor wafer, wherein the portion disposed proximate to the first metallic moat structure and the second metallic moat structure.

Depending upon the example, the present invention can achieve one or more of these benefits and/or advantages. Various embodiments provides a foundry compatible process to fabricate a MEMS Micro-speaker that can reduce the size and profile height of the speaker without affecting the performance. Various embodiments can also integrate MEMS Microphone together with the MEMS speaker in the same integrated circuit. In an example, various embodiments can integrate the CMOS audio processing within a monolithic element together with MEMS, thereby miniaturizing the whole audio chain for demanding components such as car buds, hearables, smartwatches and smart phones. In an example, various embodiments can be implemented using conventional semiconductor and MEMS process technologies for wide scale commercialization. These and other benefits and/or advantages are achievable with the present device and related methods. Further details of these benefits and/or advantages can be found throughout the present specification and more particularly below.

BRIEF DESCRIPTION OF FIGURES

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION

According to various embodiments, techniques directed to fabrication of an integrated micro-speaker and microphone using Micro Electro Mechanical Systems "MEMS" are provided. In particular, some embodiments of the present invention disclose a Foundry compatible process for fabricating a MEMS speaker device and/or a MEMS microphone device. The terminology micro-speaker and speaker has been interchangeably used with both implying a device that can generate sound wave. Although the invention has been described in terms of specific examples, it will be recognized that the invention has a much broader range of applicability.

Figure 1:
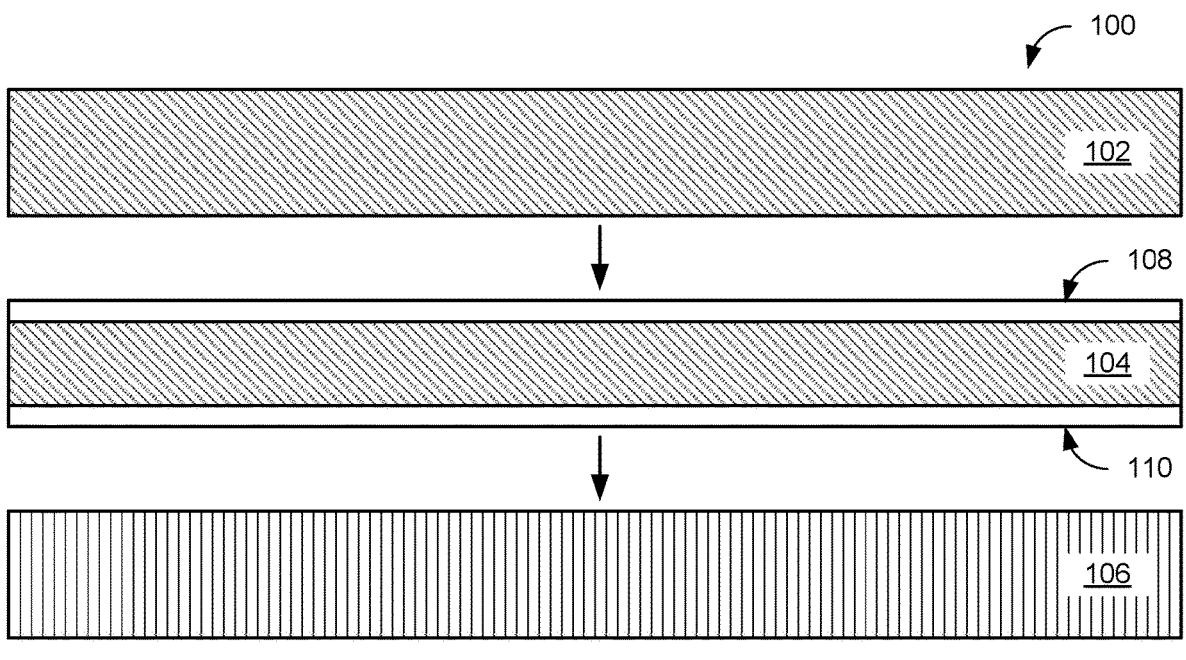
FIG. 1 is a simplified diagram of some embodiments.

FIG. 1 is a simplified diagram showing a set of wafers that are used in the fabrication of the process described in some embodiments. A device 100 typically includes a MEMS handle wafer 102, a device wafer 104 (with material (e.g. oxide) layers 108 and 110) and a CMOS wafer 106. In some embodiments, material layers 108 and/or 110 may be an oxide, such as silicon oxide, a nitride, such as silicon nitride, or other material that may be etched (e.g. vapor etched), as disclosed below. In some embodiments, wafers 102, 104 and 106 are silicon-based wafers/media. In other embodiments, wafer 104 may be semiconductor, polysilicon, carbide, graphite, or the like. For sake of convenience, reference to oxide layers 108 and 110 and semiconductor material wafer 102, 106, and 108, are used, below.

In some embodiments, MEMS wafer 102 and device wafer 104 may be processed asynchronously from the processing of CMOS wafer 106. In particular, as is illustrated in FIGS. 2A-G, MEMS wafer 102 and device wafer 104 may be processed, combined, and further processed. The combination is then bonded with CMOS wafer 106, and then further processed.

Figure 2A:
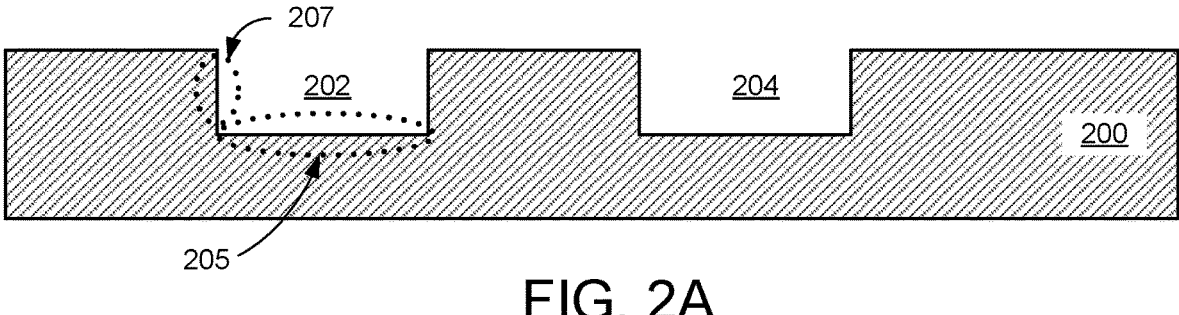
FIGS. 2A-I illustrates results of process steps according to some embodiments of the present invention.

FIGS. 2A-E illustrate results of various foundry-compatible processing steps of embodiments of the present invention. FIG. 2A illustrates a MEMS handle wafer 200, with cavities 202 and 204 that are intended for housing a micro speaker and a microphone. In various embodiments, cavities 202 and 204 are etched from MEMS wafer 200 using a single Deep Reactive Ion Etching (DRIE) process which may result in cavities 202 and 204 being approximately the same depth. In some embodiments, the planar dimension of the cavity and the depth of a cavity for a microphone may be different than for a speaker. As an example, the cavity depth for the microphone may be few microns to few tens of microns which may be shallower than the cavity depth for a speaker. The area for the cavity etch is defined using a photolithography process using a mask associated with this step. In some embodiments, if the cavity depths for micro-speaker and the microphone are to be different, then two separate masks and two separate DRIE processes may be needed to accomplish this step.

In some embodiments, a series of grooves, bumps, ridges or other type of geometric structure may be etched or otherwise formed on the sidewalls and/or bottoms of cavities 202 (e.g. 205 and 207) and/or 204. These geometric structures may be used to inhibit stiction of a movable diaphragm (discussed below), disposed within cavities 202 and/or 204, against the sidewalls (e.g. 205) or bottoms (e.g. 207) of respective cavities 200 and/or 204.

Figure 2B:
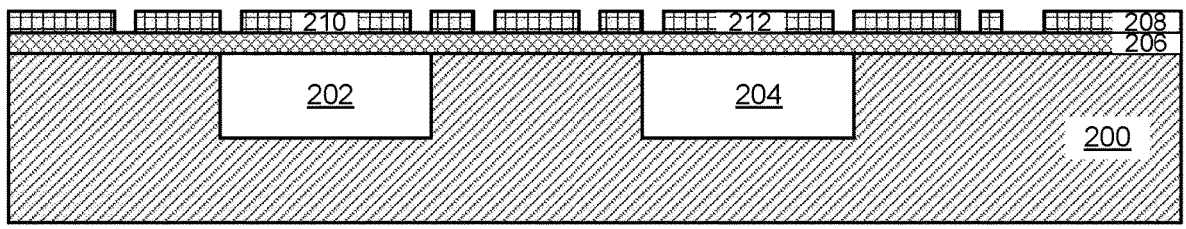

FIG. 2B illustrates a result of subsequent processes. In these processes, a device wafer (e.g. device wafer 104 having oxide layers 108 and 110), is bonded to wafer 200. In some cases, a fusion bonding process may be used. In this example, oxide layer 108 appears as oxide layer 206, and a portion of device layer 104 appears as layer 208.

After the wafer bonding, oxide layer 108 and device layer 104 are grinded down to obtain the desired thickness for a diaphragm layer 208. This process step can be accomplished, for example, using Chemical Mechanical Planarization (CMP), polishing, or the like. In various embodiments, portions of diaphragm layer 208 are used as a diaphragm for a micro-speaker, a microphone, or the like. In various embodiments, an initial thickness of the device wafer 104 may be a few hundred microns, and a thickness of diaphragm layer 208 can range from fractions of micrometers to a few micrometers. Alternatively, the device diaphragm can be deposited with the desired thickness as polysilicon using Low Pressure Chemical Vapor Deposition (LPCVD), or the like, rather than being thinned from an existing thick layer of silicon.

In various embodiments, photo lithographical steps may then be performed upon diaphragm layer 208 to define, the speaker diaphragm 210, the microphone diaphragm 212, and other mechanical elements (e.g. springs that couple diaphragms 208 and 210 to wafer 200, and the like). Subsequently, a silicon dioxide layer 214 may be deposited, to passivate the top and the side walls of the etched device layer 208, including structures 210 and 212, and the like, to protect them from the subsequent etching steps via LPCVD, Plasma Enhanced Chemical Vapor Deposition (PECVD), or the like.

Figure 2C:
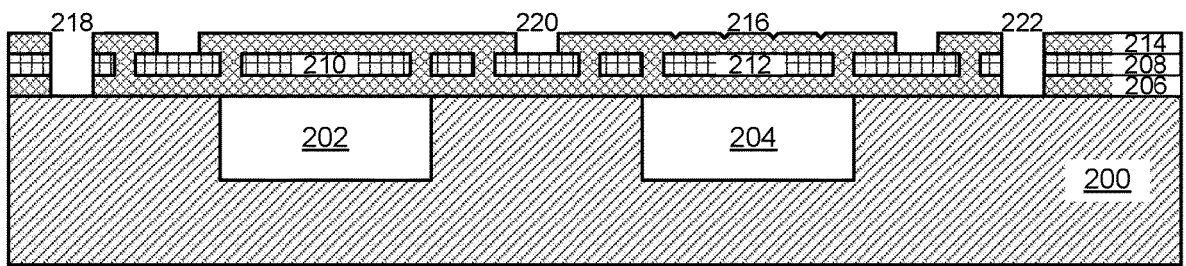

FIG. 2C illustrates a result of subsequent processes. In various embodiments, a photo resist layer (not shown) may be deposited on layer 214 and an oxide etching process can be performed to form notches 216. As will be illustrated below, notches 216 may be used to create polysilicon bumps or the like. The polysilicon bumps will provide a reduced gap between the microphone diaphragm 212 and a sensing surface (shown below) to provide higher sensitivity for the microphone. In some embodiments, structures such as mechanical stoppers or bumps, can be created using notches 216 or the like to limit the out of plane motion of the microphone diaphragm. Portions of unpatterned regions on layer 214 will be used to define an air gap, as will be illustrated below. In other embodiments, other processes may be used.

In additional embodiments, the photoresist layers or additional photoresist layers (not shown) may also be deposited on layer 214 and etching processes can be performed to define various contact regions, e.g. 218, 220, 222, etc. These contact regions allow electrical contact between subsequent layers and the mechanical device layers illustrated. In some embodiments, oxide reactive ion etching (RIE) may be used in contact regions such as 220, and oxide RIE and silicon RIE may be used in contact regions 218 and 222, or the like.

Figure 2D:
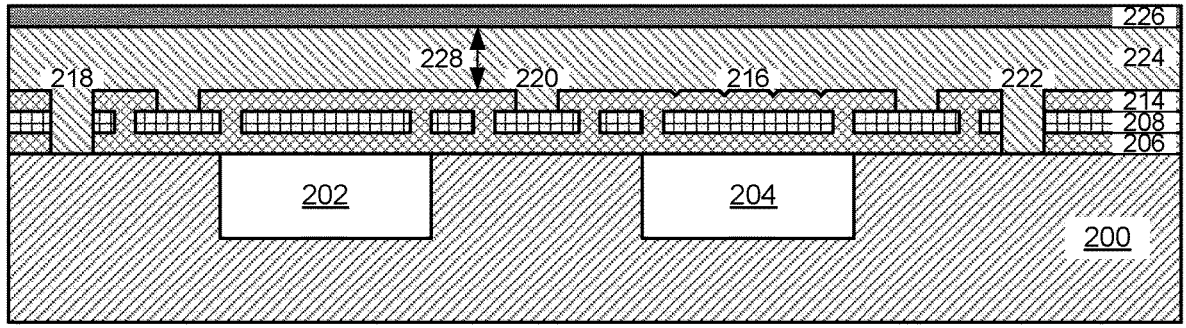

FIG. 2D illustrates a result of subsequent process steps. In various embodiments, a silicon material layer 224 is then deposited on top of the device wafer of FIG. 2C, and can fill contact regions 218, 220, 222, etc. In some instances, silicon material layer 224 may be conductive polysilicon or other conductive material. Material layer 224 may be formed in a number of ways, such as deposited in a high temperature epitaxial reactor (epi-poly) or deposited at lower temperature with the process of Low Pressure Chemical Vapor Deposition (LPCVD), or the like. In various embodiments, the thickness 228 of the silicon layer 224 can vary from hundreds of nanometers to a few tens of micro-meters. As will be understood from subsequent steps, the thickness 228 may be related to a designed vertical cavity gap needed for the micro speaker and microphone. This vertical cavity gap is directed to the out of plane motion (e.g. up and down) of diaphragms 208 and 210. In various embodiments, a CMP step may optionally then be applied to polish the surface of the sacrificial silicon 224 and to achieve the desired thickness 228.

In various embodiments, a conductive material layer 226, such as Germanium or similar material is then sputtered on top of silicon material layer 224. In some examples, Germanium is used for enabling bonding such as Eutectic bonding using, for example, Aluminum-Germanium (AlGe) bond, as will be seen in subsequent steps. In other embodiments, other types of bonding are contemplated, such as fusion bonding, and the like.

Figure 2E:
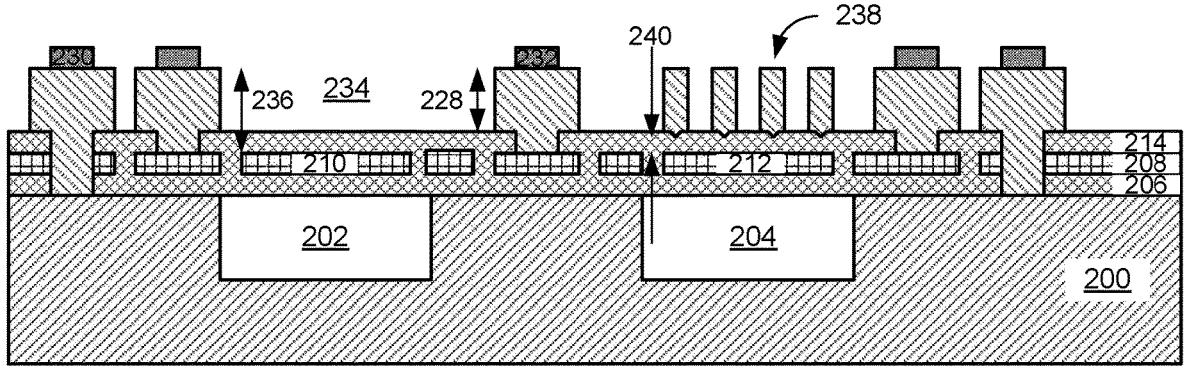

FIG. 2E illustrates a result of subsequent process steps. In various embodiments, conductive material layer 226 may be patterned by any conventional process, e.g. photoresist, plasma, etc., to form a number of Eutectic bonding sites, e.g. 230, 232, etc. Additionally a photoresist layer (not shown) may be deposited upon the top surface of this wafer, and various etching techniques may be performed to etch material layer 224 as shown. In some cases processing steps including RIE, DRIE, or the like may be performed to pattern material layer 224. In some embodiments, these etching processes removes portions of sacrificial silicon layer 224 from an area where a cavity 234 is created. This cavity 234 gives speaker diaphragm 210 space to move vertically. As is illustrated, the height 236 of cavity 234 above diaphragm 210 is approximately the thickness 228 of the silicon material layer 224 that was etched away to create the cavity. Additionally, the etching process removes portions of silicon layer 224 from an area where a backplate 238 is formed. In some embodiments, backplate 238 is used as the sensing element for microphone diaphragm 212. As is illustrated, the height 240 between backplate 238 and diaphragm 212 is approximately the thickness of oxide layer 214.

Figures 2F, 2G, 2H:
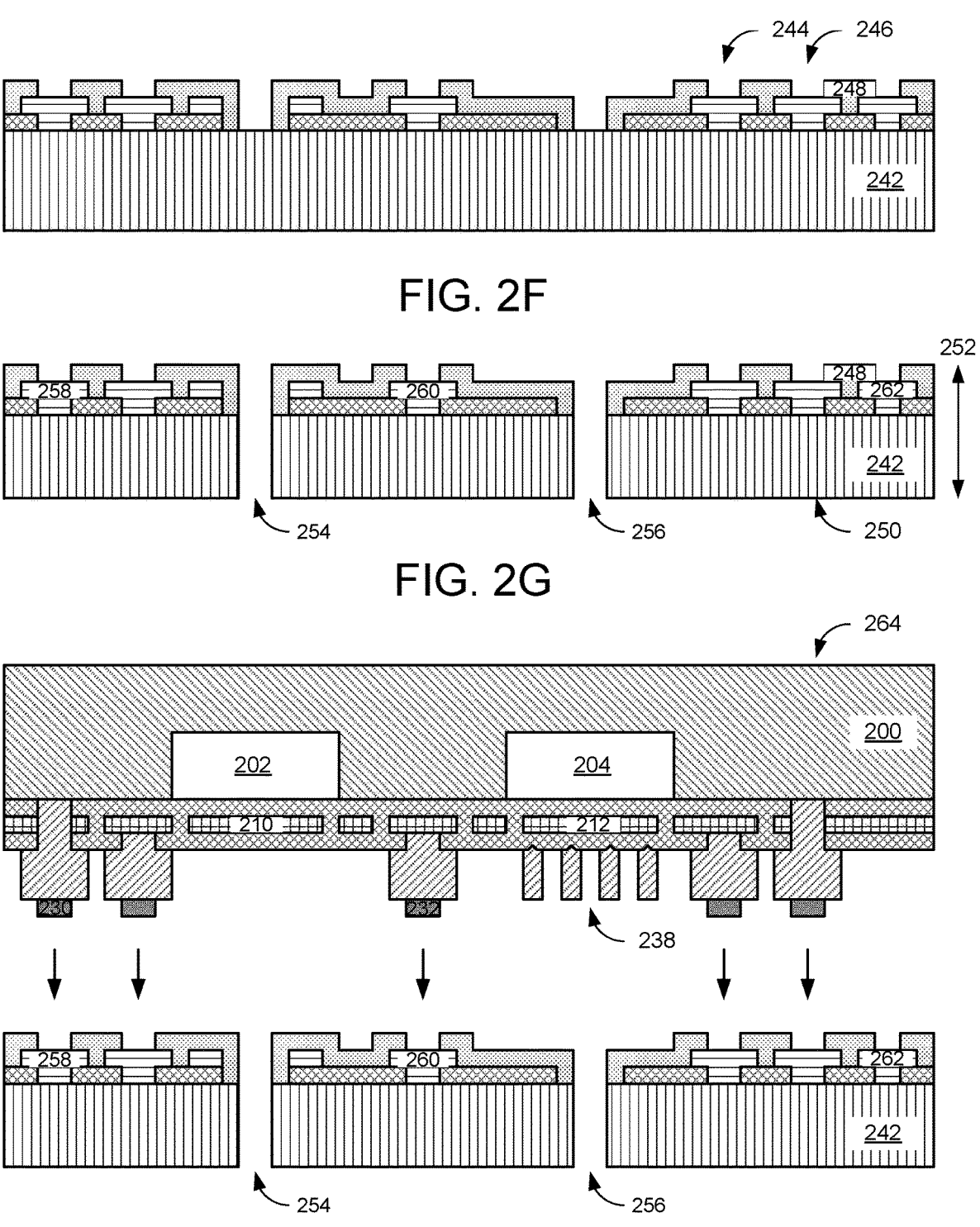

FIG. 2F illustrates a CMOS wafer after conventional processing steps. In this example, CMOS wafer 242 is illustrated including active devices 244 and one or more metal layers 246. Active devices 244 (e.g. transistors, etc.) and metal layers 246 may include circuitry for MEMS handle wafer 200 including microphone and/or micro speaker driving circuitry, reading circuitry, processing circuitry, an amplifier circuitry, an encoder circuitry, a decoder circuitry, a signal processor circuitry, a digital signal processor circuitry, and the like. In some embodiments, the top surface and oxide of the processed CMOS wafer 242 is passivated with Nitride material layer 248 (e.g. SixNy). Layer 248 is typically used to generally protect active devices 244 and metal layers 246, as well to protect these devices from subsequent Vapor Hydrogen Fluoride (VHF) etches described below.

FIG. 2G illustrates a result of subsequent processing steps. In various embodiments, a backside 250 of the CMOS wafer 242, a surface opposite to the metal layers, may be polished with CMP and/or grinded down to until a desired thickness 252 of CMOS wafer 242 is achieved. Additionally, in some embodiments, vent holes 254 and 256 are etched with RIE, DRIE, or the like in CMOS wafer 242. Locations for vent holes 254 and 256 are typically located in the areas identified on wafer 200 for the speaker (e.g. diaphragm 210) and microphone (e.g. diaphragm 212) as shown in FIG. 2E. In some embodiments, vent holes 254 and 256 may be etched from the top or backside 250 of CMOS wafer 242.

In various embodiments, pads 258, 260, 262 and the like are exposed through material layer 248. These contact pads (e.g. 258, 260) are locations where CMOS wafer 242 may be electrically coupled to MEMS wafer 200, and contact pads (e.g. 262) may be locations where CMOS wafer 242 will support have wire bonds. In various embodiments, contact pads may be aluminum or other contact material. In the case of aluminum contact pads, the aluminum material may form a eutectic bonds with germanium material (e.g. 226) of device wafer 200.

FIG. 2H illustrates a wafer bonding process. In various embodiments, device wafer 200 (e.g. the wafer stack of combined device wafer 102 and handle wafer 104) is turned upside down and disposed on CMOS wafer 242. As can be seen in this embodiment, cavity 202 and micro speaker diaphragm 210 may be vertically disposed above vent hole 254, cavity 204, microphone diaphragm 212, and backplate 238 may be vertically disposed above vent hole 256. In some embodiments, vent holes need not be centered above the respective cavities. In other embodiments, multiple micro speakers, multiple microphones, or the like may be disposed within a combined wafer 264.

As can be seen in this embodiment, germanium bonding site 230 will be disposed upon aluminum contact pad 258, bonding site 232 will be disposed upon contact pad 260, and the like. In some examples, to form a eutectic bond between these respective bonding sites and contact pads, wafers 200 and 242 are typically pressed against each other and heated to approximately 400 degrees C., although different conditions may be used in other examples.

Figures 2I, 3:
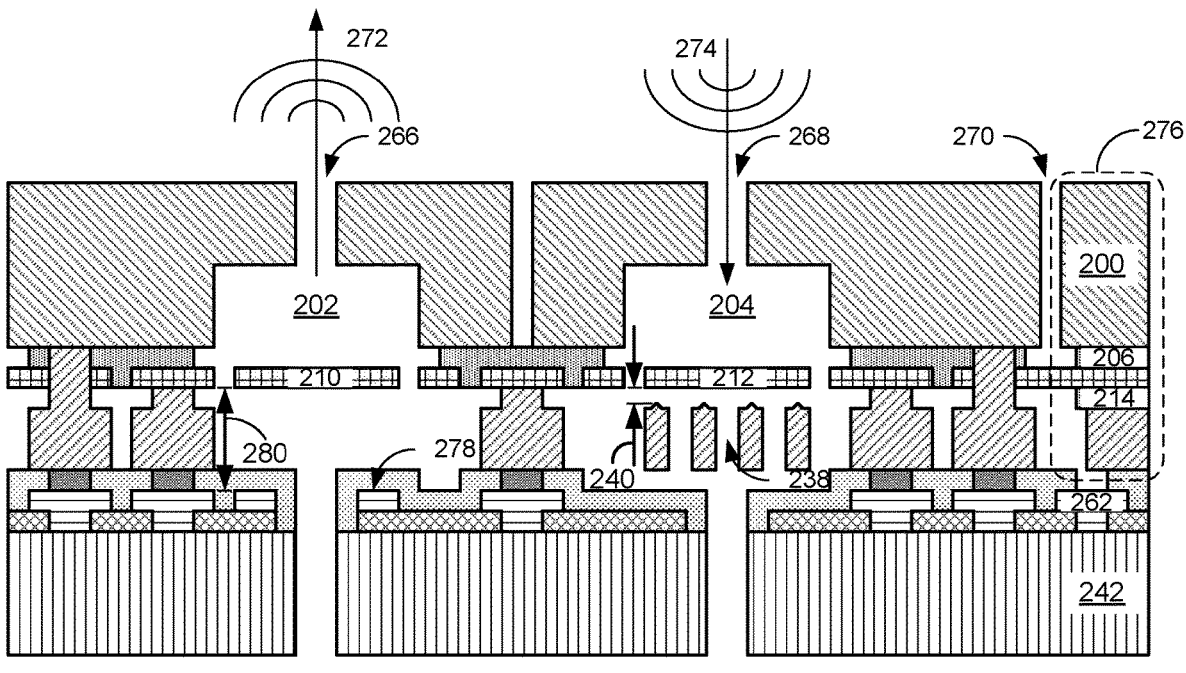
FIG. 3 shows cross section of a packaged embodiment.

FIG. 2I illustrates a result of subsequent processing steps. In various embodiments, multiple openings (e.g. holes 266 and 268) or channels (e.g. 270) may be etched through MEMS wafer 200 using an RIE, DRIE process, or the like. In this example, vent hole 266 is typically disposed above cavity 202 and micro speaker diaphragm 210; and vent hole 268 is typically disposed above cavity 204, microphone diaphragm 212 and backplate 238. These vent holes respectively allows soundwaves to pass outwards 272 from the micro speaker diaphragm 210 to the external environment and allows soundwaves to pass inwards 274 from the external environment to the microphone diaphragm 212. Additionally, the multiple holes and channels enable Vapor Hydro Fluoric (VHF) material to enter between MEMS wafer 200 and CMOS wafer 242.

In various embodiments, combined wafer 264 may then be processed with a Vapor Hydro Fluoric (VHF) etch. As mentioned above, the multiple openings (e.g. 266, 268, 270) are configured to allow VHF to be channeled between MEMS wafer 200 and CMOS wafer 242. In operation, the VHF is used to etch away portions of oxide layers 206 and 214. In particular, portions of oxide layers 206 and 214 surrounding micro speaker diaphragm 210 and associated spring elements are etched away. Further, portions of oxide layer 206 above and surrounding microphone diaphragm 212 and associated spring elements are etched away, and portions of oxide layer 214 between microphone diaphragm 212 and backplate 238 and associated spring elements are etched away. As a result of the above processes, micro speaker diaphragm 210 is suspended and can be directed to move within cavity 202 to generate sound pressure, and microphone diaphragm 212 is suspended and can move relative to backplate 238 to sense sound pressure. As can be seen in FIG. 2I, a distance between diaphragm 212 and backplate (electrode) 238 is height 240, approximately the same thickness as layer 214, before it is etched away, as shown. Further, a distance between diaphragm 210 and backplate (electrode) 278 is height 280. In some embodiments, height 240 may be within a range of 0.1 to 5 microns, 0.3 to 3 microns, 0.5 to 1 microns, or the like; height 280 may be within a range of 4 to 20 microns, 5 to 10 microns, 3 to 7 microns, or the like.

FIG. 3 illustrates an embodiment of a completed device. In this example, beginning with the embodiment illustrated in FIG. 2I, a MEMS tab portion 276 is removed to expose CMOS bond pads, e.g. contact pad 262. In some embodiments, this can be done by dicing tape or a mechanical fixture that is attached to tabs portion 276 and then removed. In various embodiments, multiple completed devices are thus formed on a wafer.

At this stage in the process, product-level wafer testing and sorting of devices can be performed by applying signals and receiving data from external test systems via the exposed CMOS bond pads. Next, the wafer is then mounted on a dicing tape, or the like and diced using stealth dicing, or the like. Singulated device dies, e.g. die 302 are then available for assembly as shown in FIG. 3.

In various embodiments, die 302 is then coupled via an interposer material 304 (e.g. epoxy, resin) to a printed circuit board (e.g. PCB) 306. In various embodiments, a metal housing 306 may be coupled to PCB 306 to provide electrical contacts and isolation of combined wafer 302, and the like. As shown, metal housing 312 typically includes one or more opening 314 where sound pressure from micro speaker 316 can exit metal housing 312 and where sound pressure from external sources can reach microphone 318. In some cases, opening 314 may include a mesh-like material 316 that reduces humidity, dust, dirt or other contaminants from entering metal housing 312.

In various embodiments, PCB 306 may include a number of metallic contacts or terminals, e.g. 308. In various embodiments, the metallic contacts may be electrically coupled to circuitry within CMOS portion 320 and/or to portions of MEMS portion 322 of combined wafer 302. In one example, wire bonds, e.g. 310 are coupled to contact pads, e.g. 262, and the like.

In some embodiments, micro speaker 316 may be driven by three different signals: speaker_top, speaker_dia, and speaker_bottom, which may be provided from external sources or internally provided. In this example, CMOS portion 320 provides speaker_top 324 and speaker_dia 326 to MEMS portion 322. As shown, speaker_top 324 is coupled to the top portion 330 of microspeaker 316 cavity. Further, speaker_dia 326 may be coupled to the diaphragm 327 of microspeaker via the above-mention spring/suspension structures. Additionally, speaker_bottom 332 may be coupled to the bottom portion (e.g. backplate 335) of microspeaker cavity 316. In exemplary operation, the audio signals on speaker_top and speaker_bottom are out of phase (opposite phase) and speaker_dia, may be held constant. As an example, speaker_top may vary in time: 20V, 40V, 0V, 20V, while speaker_bottom may vary in time: 20V, 0V, 40V, 20V, and speaker_dia may be held at 20V. In other embodiments, the bias voltages and amplitudes of speaker_top, speaker_bot, and speaker_dia may vary. In one example, the differential signals of speaker_top and speaker_bot causes speaker diaphragm 327 to move out-of plane (e.g. upwards and downwards within microspeaker 316 cavity), thus producing sound.

In some embodiments, microphone 318 may be driven/sensed by three different signals: mic_top, mic_dia, and mic_bottom, which may be driven/sensed from external sources or internal sources. In this example, CMOS portion 320 provides mic_top 328, mic_dia 330, and mic_bottom 332 to MEMS portion 322. As shown, mic_top 328 is coupled to the top portion 334 of microphone 318 cavity. Further, mic_dia 330 may be coupled to the diaphragm 329 of microphone 318 via the above-mentioned spring/suspension structures. Additionally, mic_bottom 332 may be coupled to the backplate 336. In operation, a DC bias voltage may be applied to mic_bottom and/or mic_dia, and when microphone diaphragm 329 moves out-of-plane movement (e.g. upwards and downwards) in response to a received sound, a change of capacitance across mic_dia 330 and mic_bottom 332 is sensed.

Figure 4A:
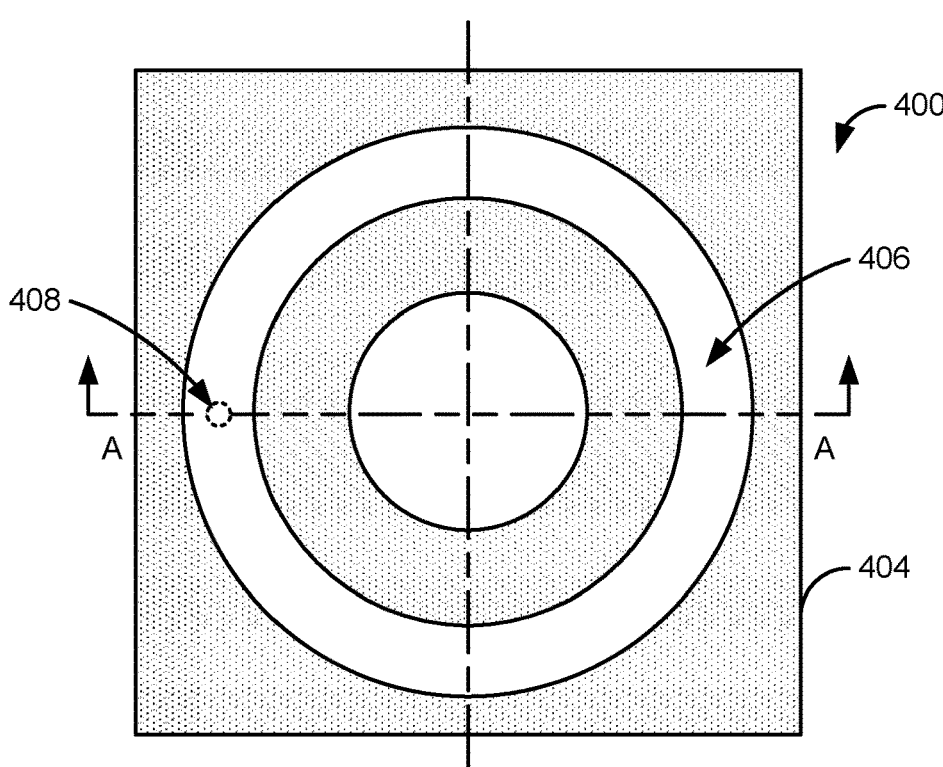
FIGS. 4A-B illustrate a device configuration according to some embodiments.
Figure 4B:
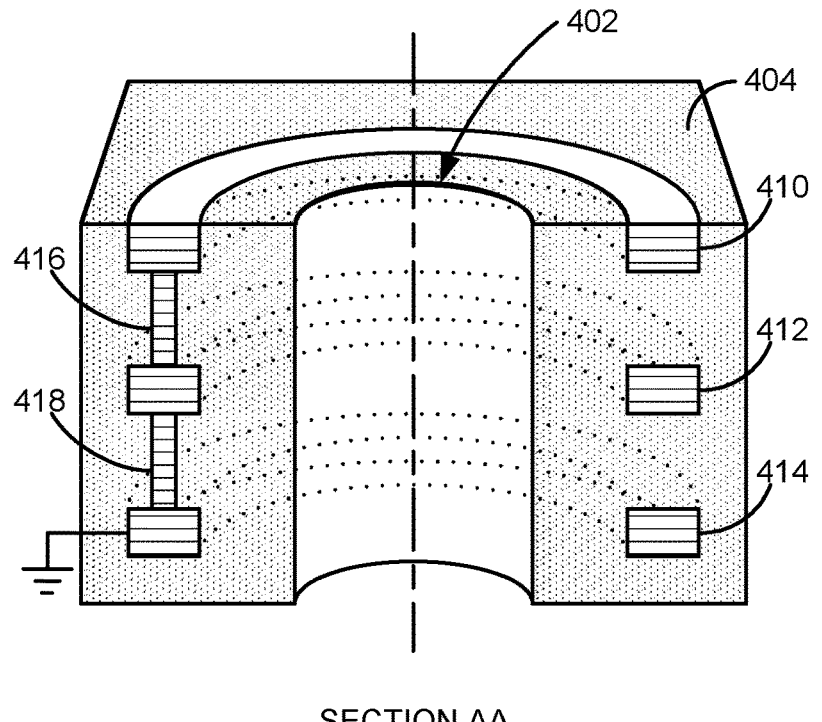

FIGS. 4A-B illustrate a DRIE process according to various embodiments. As is known, DRIE processes typically generate high impact ions to etch vent holes 254 and 256, as was illustrated in FIG. 2G. Typical drawbacks to using include that the high energy ions can potentially damage other active devices on a fabricated CMOS wafer, such as CMOS wafer 242. Accordingly, a configuration illustrated in FIGS. 4A-B are shown that attempts to limit the impact of the DRIE ions on active devices in the neighboring areas.

FIG. 4A illustrates a top view 400 of various embodiments. Specifically, FIG. 4A illustrates a structure, e.g. hole 402 etched through a CMOS wafer 404 using a DRIE, RIE, or the like. Also shown are metallic structures 406 that are positioned around where DRIE etching of hole 402 is to be performed, including vias 408. The locations on device where vent holes or other channels are to be etched are known ahead of time, accordingly, during a chip layout, conductive or metallic structures 406, i.e. toroidal rings, may be formed in multiple layers in the device. In various cases, some or all of these conductive structures may be coupled together and may be coupled together by one or more vias 408, to ground, or the like. In the case of buried doped wells within a CMOS wafer, a conductive or metallic structure may separately be tied to ground, or the like.

FIG. 4B illustrates a perspective section view of FIG. 4A. In this figure, a vent hole area 402 may be created with a DRIE process. In this embodiment, a structure 410 is formed in a Metal 3 layer, a structure 412 is formed in a Metal 2 layer, and a structure 414 is formed in a Metal 1 layer, and the like. In some embodiments, structures may have a similar shape, e.g. toroidal, and in other embodiments, the shapes may be different. As illustrated in this example, multiple vias, e.g. 416 and 418 may be used to electrically couple structures 410, 412 and 414. In other embodiments, a single via may be used, and structures 410, 412 and 414 may be coupled to the single via. In operation, these structures help absorb excess ions generated during the DRIE process and thus preventing the ions from damaging active devices on the CMOS wafer 404. In some examples, the electrically grounded structures formed within the one or more metal layers serve as moats or sinks for the excessive ions that are used to etch through the device. These moats ground the ions so that the ions do not harm or change the characteristics of MOS devices on the CMOS wafer.

Further embodiments can be envisioned to one of ordinary skill in the art after reading this disclosure. In some embodiments, the wafer identified as CMOS wafer 242 may simply be a wafer with metallic interconnects similar to CMOS wafer 242 shown above, but lack active devices, e.g. transistors, and the like. Bonding of contacts between MEMS handle wafer 200 and wafer 242 may still be performed in some cases. In various embodiments MEMS handle wafer 200 may not be flipped relative to CMOS wafer 242 and stacked upon CMOS wafer 242, as illustrated in FIG. 2H. In some embodiments, MEMS handle wafer 200 and CMOS wafer 242 may be placed or mounted proximate to each other upon a common substrate, e.g. PCB 306, under a common metal housing, e.g. 312 in FIG. 3. Contacts, e.g. 324, 326, 328, 330, 332, and the like shown between MEMS portion 322 and CMOS portion 320 in FIG. 3, may then be facilitated via wire bonding, or the like, similar to wire bond 310.

In other embodiments, multiple MEMS speakers or MEMS microphones may be formed upon a common MEMS handle wafer 200, using the processes disclosed above. In some embodiments, one MEMS speaker may be optimized for one band of audio output (e.g. midrange), one MEMS speaker may be optimized for another band of audio output (e.g. bass), and the like; and one MEMS microphone may be optimized for one band of audio input (e.g. high frequency), one MEMS microphone may be optimized for another band of audio input (e.g. bass), and the like. In some cases, frequency band directed/cross-over functionality may be implemented by active and/or passive devices formed within CMOS wafer 242, within MEMS handle wafer 200, or via external devices, e.g. discrete passive capacitors, inductors, resistors, and the like disposed upon PCB 306, for example. Additionally, in still other embodiments, one or more MEMS microphones and one or more MEMS speakers may be formed monolithically as was illustrated in the figures above.

In other embodiments, structures 410, 412, 414, etc. may have different shapes from each other. Further, they may be approximately circles, approximately square, approximately rectangular, approximately polygons (e.g. hexagons), or the like. In some embodiments, structures 410, 412, 414, etc. may not be closed structures, but may be concave structures, e.g. having a C-type shape, a comb shape, etc., where vent hole area 402 may be within the concave area, partially within the concave area, or the like. As an example a structure for a Metal 1 layer may be C-shaped, with an opening to the right, a Metal 2 layer may be a spiral shape with an opening to the left, a Metal 3 layer may be approximately square and have an approximately square hole therein, and the like.

The block diagrams of the architecture and flow charts are grouped for ease of understanding. However, it should be understood that combinations of blocks, additions of new blocks, re-arrangement of blocks, and the like are contemplated in alternative embodiments of the present invention. The specification and drawings are, accordingly, to be regarded in an illustrative rather than a restrictive sense. It will, however, be evident that various modifications and changes may be made thereunto without departing from the broader spirit and scope of the invention as set forth in the claims.

We claim:

1. A Micro-Electric Mechanical System (MEMS) audio device comprising:

receiving a first wafer comprising a first substrate characterized by a first surface, wherein a first cavity is formed within the first substrate;

disposing a device layer upon the first wafer, wherein the device layer comprises a semiconductor material having a first side and a second side, wherein the semiconductor material comprises a first semiconductor material portion, wherein a first material layer is formed upon the first side, wherein a second material layer is formed upon the second side, wherein a first portion of the first material layer is disposed above the first semiconductor material portion, wherein a first portion of the second material layer is disposed below the first semiconductor material portion, and wherein the first material layer is disposed against the first surface;

forming a first plurality of contacts through the second material layer to at least the semiconductor material;

receiving a second substrate wafer, wherein a plurality of metal layers are disposed within the second substrate wafer, wherein a first plurality of vent holes are formed through the second substrate wafer, and wherein a second plurality of contacts are formed on a first surface of the second substrate;

coupling the first plurality of contacts to the second plurality of contacts;

forming a second plurality of vent holes through the first substrate, wherein a first vent hole from the second plurality of vent holes is coupled to the first cavity;

etching at least the first portion of the first material layer and the first portion of the second material layer from around the first semiconductor material portion such that the first semiconductor material portion is substantially free from the first material layer and the second material layer; and wherein the first semiconductor material portion forms a diaphragm for the MEMS audio device configured to move within the first cavity.

2. The method of claim 1 wherein the second substrate wafer comprises a CMOS device wafer having a plurality of active devices.

3. The method of claim 1 wherein the MEMS audio device is selected from a group consisting of: a speaker and a microphone.

4. The method of claim 1 wherein the first semiconductor material portion forms a diaphragm for a speaker configured to move within the first cavity;

wherein a second cavity is formed within the first substrate of the first wafer;

wherein the semiconductor material comprises a second semiconductor material portion;

wherein a second portion of the first material layer is disposed above the second semiconductor material portion;

wherein a second portion of the second material layer is disposed below the second semiconductor material portion, and wherein the first material layer is disposed against the first surface;

wherein a second vent hole from the second plurality of vent holes is coupled to the second cavity;

wherein the method further comprising: etching at least the second portion of the first material layer and the second portion of the second material layer from around the second semiconductor material portion; and wherein the second portion of the semiconductor material forms a diaphragm for a microphone configured to move within the second cavity.

5. The method of claim 1 wherein the forming the first plurality of electrical contacts comprises:

etching through at least a first portion of the second material layer to define a plurality of contact regions;

disposing a conductive semiconductor material layer above the second material layer and into the plurality of contact regions; and etching at least a first portion of the conductive semiconductor material layer to define the first plurality of electrical contacts comprising conductive semiconductor material.

6. The method of claim 5 wherein the etching at least the first portion of the conductive semiconductor material layer further comprises:

etching at least a second portion of the conductive semiconductor material layer to define a conductive structure disposed above the second portion of the second material layer and above the diaphragm;

wherein the conductive structure comprises conductive semiconductor material; and wherein the conducive structure forms a backplane of a microphone.

7. The method of claim 1 wherein the etching at least the first portion of the first material layer and the first portion of the second material layer from around the first semiconductor material portion comprises: providing vapor hydrofluoric acid into the first cavity.

8. The method of claim 1 further comprising: performing a deep reactive ion etching (DRIE) process to the second substrate wafer to form the first plurality of vent holes.

9. The method of claim 5 wherein a distance between the diaphragm and an electrode of the MEMS audio device comprises a thickness of the conductive semiconductor layer.

10. The method of claim 5, where the semiconductor material comprises a polysilicon layer deposited in an epitaxial reactor or with Low Pressure Chemical Vapor Deposition (LPCVD).

11. A Micro-Electric Mechanical System (MEMS) audio device comprising:
a first wafer comprising a first substrate characterized by a first surface and comprising a first cavity within the first substrate, wherein the first substrate comprises at least a first vent hole formed through the first substrate and coupled to the first cavity;
a device layer disposed upon the first wafer, wherein the device layer comprises a semiconductor material having a first side and a second side, wherein a first material layer is formed upon a portion of the first side, wherein a second material layer is formed upon a portion the second side, wherein a portion of the first material layer and a portion of the second material layer are removed from the semiconductor material to provide a first portion of the semiconductor material substantially free of the first material layer and the second material layer, wherein the first material layer is disposed against the first surface of the first wafer, and wherein the device layer comprises a first plurality of electrical contacts;
a second substrate wafer disposed upon the device layer, wherein the second substrate wafer comprises at least a first vent hole formed through the second substrate wafer and coupled to the first cavity, and wherein the second substrate wafer comprises a second plurality of electrical contacts coupled to the first plurality of electrical contacts; and
wherein the first portion of the semiconductor material forms a diaphragm for the MEMS audio device and wherein the first portion of the semiconductor material is configured to move within the first cavity.

12. The device of claim 11 wherein the MEMS audio device is selected from a group consisting of: a speaker and a microphone.

13. The device of claim 11 wherein the second substrate wafer comprises a CMOS wafer having a plurality of active devices.

14. The device of claim 11
wherein the first wafer further comprises a second cavity within the first substrate; wherein the first wafer comprises a second vent-hole formed through the first substrate and coupled to the second cavity;
wherein the semiconductor material comprises a second portion of the semiconductor material substantially free of the first material layer and the second material layer;
wherein the second substrate wafer comprises at least a second vent hole formed through the second substrate wafer and coupled to the second cavity;

wherein the second portion of the semiconductor material forms a diaphragm for another MEMS audio device; and
wherein the second portion of the semiconductor material is configured to move within the second cavity.

15. The device of claim 14 further comprising:
a first electrode associated with the diaphragm for the MEMS audio device, wherein a first distance is associated with a distance between the diaphragm for the MEMS audio device and the first electrode;
a second electrode associated with the diaphragm for the other MEMS audio device, wherein a second distance is associated with a distance between the diaphragm for the other MEMS device and the second electrode; and
wherein the first distance is larger than the second distance.

16. The device of claim 15
wherein the first distance is within a range of 4 to 40 microns; and
wherein the second distance is within a range of 0.1 to 5 micron.

17. The device of claim 11
wherein the semiconductor material comprises a second semiconductor material portion; and
wherein the first plurality of electrical contacts comprises the second semiconductor material portion.

18. The device of claim 17
wherein the semiconductor material comprises a third semiconductor material portion disposed below a portion of the diaphragm; and
wherein the third semiconductor material portion forms a backplane of the MEMS audio device.

19. The device of claim 11 further comprising a CMOS device coupled to the second substrate wafer, wherein the CMOS device comprises an audio function selected from a group consisting of: an amplifier, an audio driver, an encoder, a decoder, a signal processor, a digital signal processor.

20. The device of claim 14
wherein the MEMS audio device comprises a MEMS speaker; and
wherein the other MEMS audio device comprises a MEMS microphone.

21. The device of claim 11
wherein the device layer comprises a second cavity formed between at least some electrical contacts from the first plurality of electrical contacts; and
wherein the first portion of the semiconductor material is also configured to move within the second cavity.

22. The method of claim 1 wherein forming the first plurality of contacts comprises:
etching through portions of the second material layer to expose portions of the semiconductor material;
depositing a plurality of material layers on at least the portions of the semiconductor material; and
etching the plurality of material layers to form the first plurality of contacts; and
wherein the plurality of material layers comprises polysilicon.

23. The method of claim 22 wherein the etching the plurality of material layers to form the first plurality of contacts comprises etching the plurality of material layers to form the first plurality of contacts and a second cavity.

24. The method of claim 23
wherein a portion of the plurality of material layers that are deposited on at least the portions of the semiconductor material are characterized by a thickness; and wherein a depth of the second cavity is characterized by the thickness.

25. The method of claim 4 wherein the forming the first plurality of contacts comprises:

etching through portions of the second material layer to expose portions of the semiconductor material;

depositing a plurality of material layers on the semiconductor material; and etching portions of the plurality of material layers to form the first plurality of contacts and a back pate; and wherein the plurality of material layers comprises polysilicon;

wherein a third cavity is formed between the diaphragm for the speaker and the second substrate wafer;

wherein a fourth cavity is formed between the diaphragm for the microphone and the back plate; and wherein a depth of the third cavity exceeds the depth of the fourth cavity.

* * * * *